United States Patent
Yao et al.

(10) Patent No.: US 6,455,330 B1
(45) Date of Patent: Sep. 24, 2002

(54) METHODS TO CREATE HIGH-K DIELECTRIC GATE ELECTRODES WITH BACKSIDE CLEANING

(75) Inventors: Liang Gi Yao, Hsin Chu (TW); Ming Fang Wang, Taichung (TW); Shih Chang Chen, Taoyuan (TW); Mong Song Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/056,621

(22) Filed: Jan. 28, 2002

(51) Int. Cl.[7] .............................................. H01L 21/00
(52) U.S. Cl. .............................. 438/3; 438/240; 438/287
(58) Field of Search ........................ 438/279, 286–307, 438/3, 240

(56) References Cited

U.S. PATENT DOCUMENTS

| | | | | |
|---|---|---|---|---|
| 5,382,539 A | * | 1/1995 | Nakamura | 438/237 |
| 5,403,434 A | * | 4/1995 | Moslehi | 156/643 |
| 6,020,024 A | * | 2/2000 | Maiti et al. | 427/248.1 |
| 6,020,243 A | * | 2/2000 | Wallace et al. | 438/287 |
| 6,115,867 A | * | 9/2000 | Nakashima et al. | 15/77 |

* cited by examiner

*Primary Examiner*—Jey Tsai
(74) *Attorney, Agent, or Firm*—George O. Saile; Stephen B. Ackerman

(57) ABSTRACT

A new method is provided for the creation of a layer of gate dielectric for gate electrodes having deep sub-micron dimensions. The inventions provides three embodiments of cleaning the backside of a surface that is being processed for the creation of a gate electrode over the surface thereof. Solutions of Hydrofluoric acid (HF) with different concentrations or other cleaning agents are used for the cleaning of the backside of the substrate. The steps of cleaning the backside of the substrate can be performed at different intervals of creating a layer of high-k gate dielectric and the overlying layer of polysilicon, the process of backside cleaning can be applied more than once in order to remove all residue of high-k dielectric and polysilicon from the backside of the substrate.

20 Claims, 3 Drawing Sheets

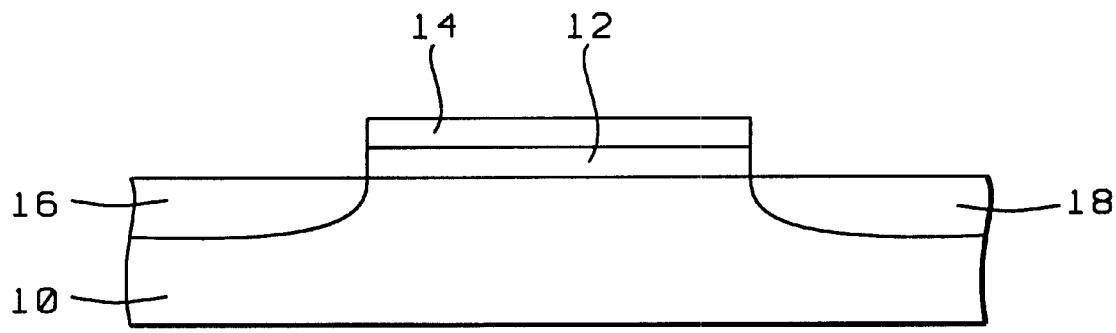
FIG. 1 – Prior Art
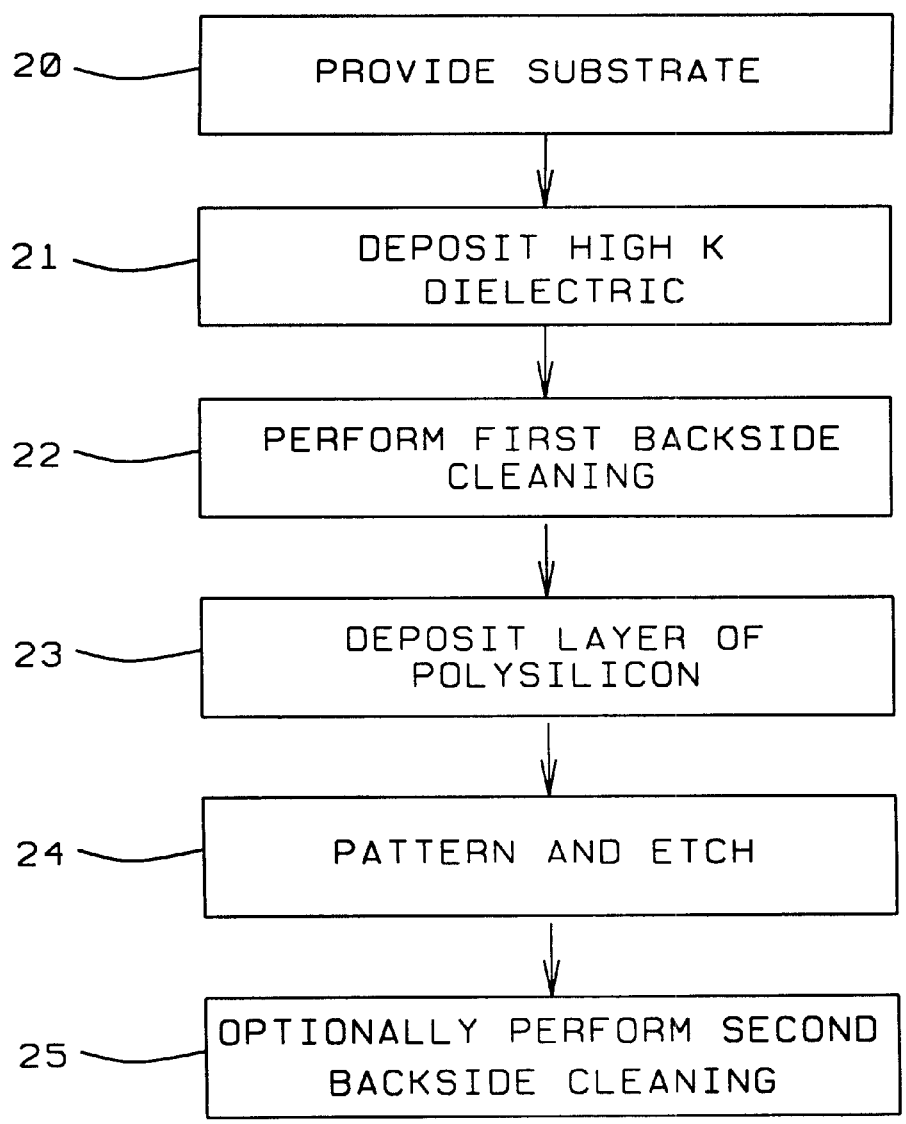
FIG. 2

METHODS TO CREATE HIGH-K DIELECTRIC GATE ELECTRODES WITH BACKSIDE CLEANING

BACKGROUND OF THE INVENTION (1) Field of the Invention

The invention relates to the fabrication of integrated circuit devices, and more particularly, to a method of applying backside cleaning of a substrate after deposition of a layer of gate oxide in order to create high dielectric constant gate oxides.

(2) Description of the Prior Art

Conventional methods of creating CMOS devices use gate electrodes of polysilicon that is deposited and patterned over a layer of gate oxide. In many applications the surface of the patterned and etched layer of polysilicon is salicided in order to meet requirements of low contact sheet resistivity. In designing CMOS devices, the performance of these devices is improved by reducing the gate length of the gate electrode or by reducing the thickness of the layer of gate oxide that is first formed over a semiconductor surface, which is typically the surface of a silicon substrate. The gate length of CMOS devices is the distance between the source and the drain regions of the device where this distance extends underneath the gate electrode. With the continued decrease in device dimensions, the gate length for sub-micron devices has been decreased to 0.25 $\mu$m or less. The invention addresses the era where gate length dimension approach 0.1 $\mu$m, for these applications of gate electrodes the Effective Oxide Thickness (EOT) is less than about 14 Angstrom. As gate dielectrics are reduced to this thickness, a practical and theoretical limit is being approached to the thermal oxidation of a silicon surface for the formation of a layer of gate oxide. In order to meet this challenge, the semiconductor industry is developing materials that can be used as replacement of the thermal oxides that are typically used for the layer of gate dielectric.

For gate electrodes that are created with a layer of gate dielectric having an EOT of 14 Angstrom, the leakage current of the gate dielectric, typically comprising oxide or oxynitride, is in excess of 10 $A/cm^2$. This results in high power consumption of the gate electrode and in concerns of gate reliability, thus having a serious negative impact on the electrical performance of the gate electrode.

For this reason, high-k metal oxide materials have been proposed as a potential material to replace the currently used thermal oxide gate dielectrics. Since the dielectric constant of metal oxide material is higher than the dielectric constant of thermal oxide, a thicker layer of metal oxide can be deposited while still achieving the required a value of EOT that is comparable to the EOT value of a thinner layer of thermal gate oxide material. The thicker layer of metal gate oxide reduces the gate-to-channel leakage current without having a negative impact on CMOS device performance and is therefore advantageous. It has for instance been found that a relatively thick layer of metal oxide gate dielectric, having a thickness of about 85 Angstrom, provides the equivalent electrical performance of a thermal oxide gate dielectric having a thickness of about 18 Angstrom.

The prior art processing that applies new materials for the layer of gate dielectric has for instance used tantalum pentoxide or the chemically growing of a layer of silicon dioxide over which a layer of tantalum pentoxide is formed. These method however have shown to introduce a series of parasitic capacitances that are interposed between the layer of the gate electrode overlying the layer of tantalum pentoxide and the underlying silicon substrate. The apparent improvement that has been introduced by the introduction of the layer of tantalum pentoxide is therefore counteracted by the concurrent introduction of parasitic capacitances, the latter negating the beneficial effects of the layer of tantalum pentoxide. It is therefore of advantage to provide a method of creating a layer of gate dielectric such that no negative side effects are introduced. The invention provides such a method.

U.S. Pat. No. 6,020,243 (Wallace et al.) shows a Zr or HF Oxide high k gate dielectric and process.

U.S. Pat. No. 5,403,434 (Moslehi) shows a wafer clean process using HF.

U.S. Pat. No. 6,115,867 (Nakashima) shows a process to clean both sides of a wafer.

U.S. Pat. No. 6,020,024 (Maiti) shows a process for hi-k metal oxides.

SUMMARY OF THE INVENTION

A principle objective of the invention is to provide a method of creating a layer of gate dielectric for application in gate electrodes of deep sub-micron dimensions.

Another objective of the invention is to provide a method of creating a layer of gate dielectric for application in gate electrodes of deep sub-micron dimensions whereby the level of contaminants is reduced.

In accordance with the objectives of the invention a new method is provided for the creation of a layer of gate dielectric for gate electrodes having deep sub-micron dimensions. Under the first embodiment of the invention, a layer of high-k dielectric constant material is deposited over the front surface of the substrate. A first backside cleaning of the wafer is performed, using solutions of Hydrofluoric acid (HF) with different concentrations for this first backside cleaning. A layer of polysilicon is deposited over the surface of the layer of high-k dielectric constant material, the layer of deposited polysilicon and the layer of high-k dielectric constant material are patterned and etched, creating a layer of gate dielectric comprising a high-k dielectric constant material over which a patterned layer of polysilicon remains in place forming a layer of a polysilicon gate electrode. Optionally, a second backside cleaning of the wafer is performed, using solutions of HF with different concentrations for this second backside cleaning.

Under the second embodiment of the invention a layer of polysilicon is deposited over the surface of the layer of high-k dielectric constant material, a first backside cleaning of the wafer is performed, using mixture solutions that are best suited for removal of contaminants of high-k dielectric constant material and polysilicon for this first backside cleaning. The layer of deposited polysilicon and the layer of high-k dielectric constant material are patterned and etched, creating a layer of gate dielectric comprising a high-k dielectric constant material over which a patterned layer of polysilicon remains in place forming a layer of a polysilicon gate electrode. Optionally, a second backside cleaning of the wafer is performed, using mixture solutions that are best suited for removal of contaminants of high-k dielectric constant material and polysilicon for this first backside cleaning.

Under the third embodiment of the invention a layer of high-k dielectric constant material is deposited over the front surface of the substrate, a layer of polysilicon is in-situ deposited over the surface of the layer of high-k dielectric constant material. The layer of deposited polysilicon and the layer of high-k dielectric constant material are patterned and etched, creating a layer of gate dielectric comprising a high-k dielectric constant material over which a patterned layer of polysilicon remains in place forming a layer of a polysilicon gate electrode. A backside cleaning of the wafer is performed, using mixture solutions that are best suited for removal of contaminants of high-k dielectric constant material and polysilicon for this backside cleaning.

BRIEF DESCRIPTION OF THE DRAWINGS

FIG. 1 shows a cross section of simplified conventional processing steps for the creation of a gate electrode.

FIG. 2 shows a flow diagram of the first embodiment of the invention.

DESCRIPTION OF THE PREFERRED EMBODIMENTS

Figure 3:
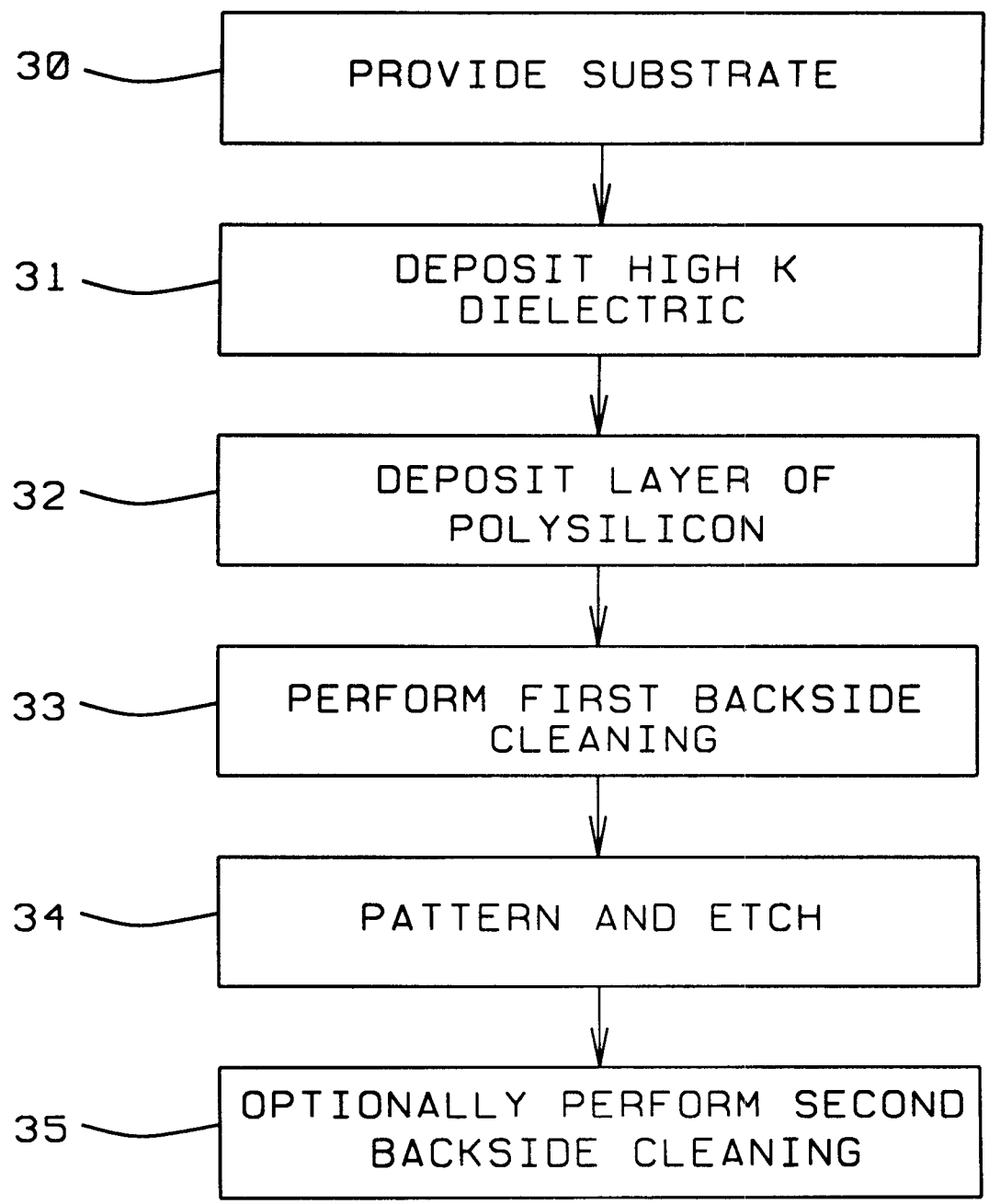
FIG. 3 shows a flow diagram of the second embodiment of the invention.

Some of the essential points that must be addressed in the creation of CMOS devices having sub-micron channel length can be highlighted as follows:

the thickness, of the layer of gate oxide must be made as small as possible since the drive current of a CMOS device increases with decreasing thickness of the layer of gate oxide; a thin layer of gate oxide allows the gate to retain strong control of the channel charge region underneath the gate electrode shallow junction depths are required for the device impurity implants, the shallow junction depths prevent the drain field from extending far into the channel region underneath the gate electrode a thin layer of gate dielectric must be grown over the surface of the substrate in a uniform manner, this to prevent uneven distribution of the electromagnetic field between the gate electrode and the channel region of the gate electrode the impurity content of the layer of gate dielectric must be very low to prevent concentration of ion migration and the therefrom following damage to the layer of gate oxide, affecting the reliability of the CMOS device it is desirable to use materials for the gate dielectric that have a dielectric constant k which is as high as possible, with a target value exceeding 12; this allows for the creation of a (physically) thick layer of gate dielectric while the effective (operational) thickness of the layer of gate dielectric is low; this avoids the concerns that are raised by the use of ultra-thin layers of gate dielectric, as highlighted above; comparatively, a thin layer of dielectric material, having a low dielectric constant and a thickness in the range of 8 and 30 Angstrom, operationally compares with a thick layer of gate dielectric having a high dielectric constant and a thickness in the range of 24 to 90 Angstrom an ultra thin layer of gate dielectric may not be able to prevent the migration of impurity implants (such as boron, implanted into a layer of polysilicon to create the conductivity of the body of the gate electrode) into the channel region of the underlying substrate, causing leakage current of the gate electrode to the substrate it is generally accepted that, in order to create gate electrodes having sub-micron device features, the effective thickness of the layer of gate dielectric must be equivalent to a conventional layer of silicon dioxide having a thickness of about 20 Angstrom or less reduced device dimensions, under constant conditions of operating voltages of the gate electrode, can result in an increase of the electrical field in the underlying silicon substrate; this increased field strength in turn may result in hot electrons or hot holes being injected from the channel region of the device into the overlying layer of gate dielectric; this charge injection results in potential damage to the layer of gate dielectric, affecting the reliability of the gate electrode; Lightly Doped Drain (LDD) regions have been the conventional answer to this concern; since however these regions are applied adjacent to both the source and the drain region, while these LDD regions are essentially required only adjacent to the drain region, the LDD implants raise the parasitic resistance between the source region and the channel region of the device, lowering the current that can flow between the source and the drain regions of the gate electrode and thus reducing the device switching speed the current that can flow through the channel region of a gate electrode is essentially determined by the source to channel interface the threshold voltage of the device is also essentially determined by the source to channel interface for sub-micron device dimensions, that is a channel length of about 0.20 $\mu$m or less, the use of LDD regions to control hot carrier injection becomes ineffective due to the small junction depth of LDD impurity implants device switching speed can be increased by either raising the current that flows between the source and the drain region of the device or by reducing (the impact of) parasitic capacitances and/or resistors on the operation of the gate electrode, and to create CMOS devices having high switching speeds, it is required that the channel length is made as short as possible, providing a shortest possible path for the electrons to travel.

As indicated above, a concerted effort is underway in the industry to provide materials that can be used as a gate dielectric of a:gate electrode. These materials must have a high dielectric constant, which allows for the layer of gate dielectric to be thicker while maintaining device performance requirements and also reducing the tunneling current through the layer of gate dielectric. The dielectric constant of the searched for materials are measured with respect to the dielectric constant of silicon dioxide, since silicon dioxide has for past device creations formed the dielectric of choice for the gate dielectric. The range of dielectric constants varies between about 3.9 for silicon dioxide and about 10 for high-k dielectric layers. Other materials that can be cited in this respect include $ZrO_2$ with a dielectric constant of about 25, $HfO_2$ with a dielectric constant of about 25 and $Al_2O_3$ with a dielectric constant of about 9.

Basic and simplified conventional processing steps that are required to create a gate electrode are briefly reviewed at this time using FIG. 1. The process starts with a semiconductor substrate, an active region 10 is designated in the surface of the silicon substrate. A thin layer 12 of gate dielectric is created over the active surface region 10 of the substrate. A layer 14 of gate electrode material, typically comprising polysilicon, is deposited over the surface of layer 12 of gate dielectric. Layers 12 and 14 of respectively gate dielectric and polysilicon are then etched, forming the patterned layers 12 and 14 that are shown in cross section in FIG. 1. Impurity implants are performed into the surface 10 of the silicon substrate, creating source impurity concentration 16 and drain impurity concentration 18, impurity concentrations 16 and 18 are self-aligned with the body of the gate electrode comprising patterned layers 12 and 14. Remaining steps of creating a gate electrode may comprise steps of gate spacer formation, salicidation, thermal anneal and the formation of contact points to the gate structure. The channel region 20 forms an electrical interface between the source 16 and the drain 18. A voltage difference between the source region 16 and the drain region 18 will result in a current flowing through the channel region 20 from source 16 to drain 18. By applying a voltage to the gate structure 12/14, the distribution of the electromagnetic field in the channel region 20 is altered. This provides the ability to influence and control the current that flows between the source region 12 and the drain region 14. Layer 12 forms an insulating layer of separation between the body of the gate electrode, which is essentially layer 14, and the channel region 20. It is one of the objectives of the design of a gate electrode to assure that little or no current flows through the insulating layer 12 and that, as a consequence, layer 12 forms a stress relieve layer between layer 14 and the underlying surface 10 of the silicon substrate that only transmits changes in electrical potential from layer 14 to the underlying layer 10 of the silicon substrate.

With the reduction in gate dimensions, the thickness of layer 12 must be accordingly reduced. It is a basic requirement of the CMOS device that this device produces as large a current as possible, which can be achieved by increasing the length of the channel region 20. The reduction in gate dimensions brings with it a reduction in the length of the channel region 20, which is contrary to design objectives. This contrary effect has been compensated for by reducing the thickness of the layer 12 of gate dielectric, enhancing the effectiveness of the voltage transfer from the gate layer 14 to the underlying channel 20. Present state of the art has reduced the thickness of layer 12 of gate oxide to about 14 Angstrom, which is cause for a number of new concerns. These concerns are the introduction of leakage current between the gate layer 14 and layer 10 of the substrate (the tunneling effect), the need for extreme control of the process that is used to create the layer 12 of gate dielectric, the need to create a layer 12 of uniform thickness across the surface 10 and the concern that an extremely thin layer of gate dielectric forms a poor diffusion barrier to impurities.

The above highlighted layers of high-k dielectric constant materials that are preferred to be used for the formation of a layer of gate dielectric typically require high deposition temperatures while these materials readily lead to metal contamination during the subsequent processing steps. The deposition of such layers of metal oxides, to be used as gate dielectrics, must therefore be performed meeting precise and highly controlled processing conditions while, in addition, steps must be taken to prevent or to eliminate any undesired depositions of the high-k dielectric. The invention provides such steps. It must thereby be realized that the creation of gate electrodes comprises performing processing step that essentially affect the front surface, that is the active surface of the substrate. Deposition of high-k dielectric constant materials however is not necessarily limited to the front surface of the substrate but can, due to nature of the process of deposition, deposit contaminants on the backside of the wafer. These contaminants may contain a high concentration of the deposited high-k dielectric material in addition the others. During subsequent processing steps that are required for the formation and completion of the gate electrode, these contaminants are likely to be removed from the surface on which the contaminants have been allowed to accumulate. This creates a processing environment during which the now free-floating contaminants can become part of additional device elements that are being formed, which is highly undesirable from a processing point of view. The invention addresses this issue and provides procedures that prevent contamination by residues of high-k dielectric constant gate dielectric materials.

Referring now specifically to FIG. 2, there is shown a flow diagram of the first embodiment of the invention. The processing steps that are provided under the first embodiment of the invention are as follows:

FIG. 2, step 20, providing a semiconductor substrate

FIG. 2, step 21, depositing a layer of high-k dielectric constant material over the front surface of the substrate FIG. 2, step 22, performing a first backside cleaning of the wafer, using solutions of HF with different concentrations for this backside cleaning FIG. 2, step 23, depositing a layer of polysilicon over the surface of the layer of high-k dielectric constant material FIG. 2, step 24, patterning and etching the layer of deposited polysilicon and the layer of high-k dielectric constant material, creating a layer of gate dielectric comprising a high-k dielectric constant material over which a patterned layer of polysilicon remains in place forming a layer of a polysilicon gate electrode, and optionally, FIG. 2, step 25, performing a second backside cleaning of the wafer, using solutions of HF with different concentrations for this second backside cleaning.

For the backside cleaning of the wafer, solutions of Hydrofluoric acid (HF) are used with different concentrations of HF. As an example can be cited a wet etching with a HF (Hydrofluoric acid) containing a solution like buffered oxide etchant (BOE). The BOE may comprise a mixed solution of fluoroammonium and fluorohydrogen (7:1) and phosphoric acid solution.

Referring now specifically to FIG. 3, there is shown a flow diagram of the second embodiment of the invention. The processing steps that are provided under the second embodiment of the invention are as follows:

FIG. 3, step 30, providing a semiconductor substrate

FIG. 3, step 31, depositing a layer of high-k dielectric constant material over the front surface of the substrate FIG. 3, step 32, depositing a layer of polysilicon over the surface of the layer of high-k dielectric constant material FIG. 3, step 33, performing a first backside cleaning of the wafer, using mixture solutions that are best suited for removal of contaminants of high-k dielectric constant material and polysilicon for this first backside cleaning FIG. 3, step 34, patterning and etching the layer of deposited polysilicon and the layer of high-k dielectric constant material, creating a layer of gate dielectric comprising a high-k dielectric constant material over which a patterned layer of polysilicon remains in place forming a layer of a polysilicon gate electrode, and optionally, FIG. 3, step 35, performing a second backside cleaning of the wafer, using mixture solutions that are best suited for removal of contaminants of high-k dielectric constant material and polysilicon for this first backside cleaning.

Figure 4:
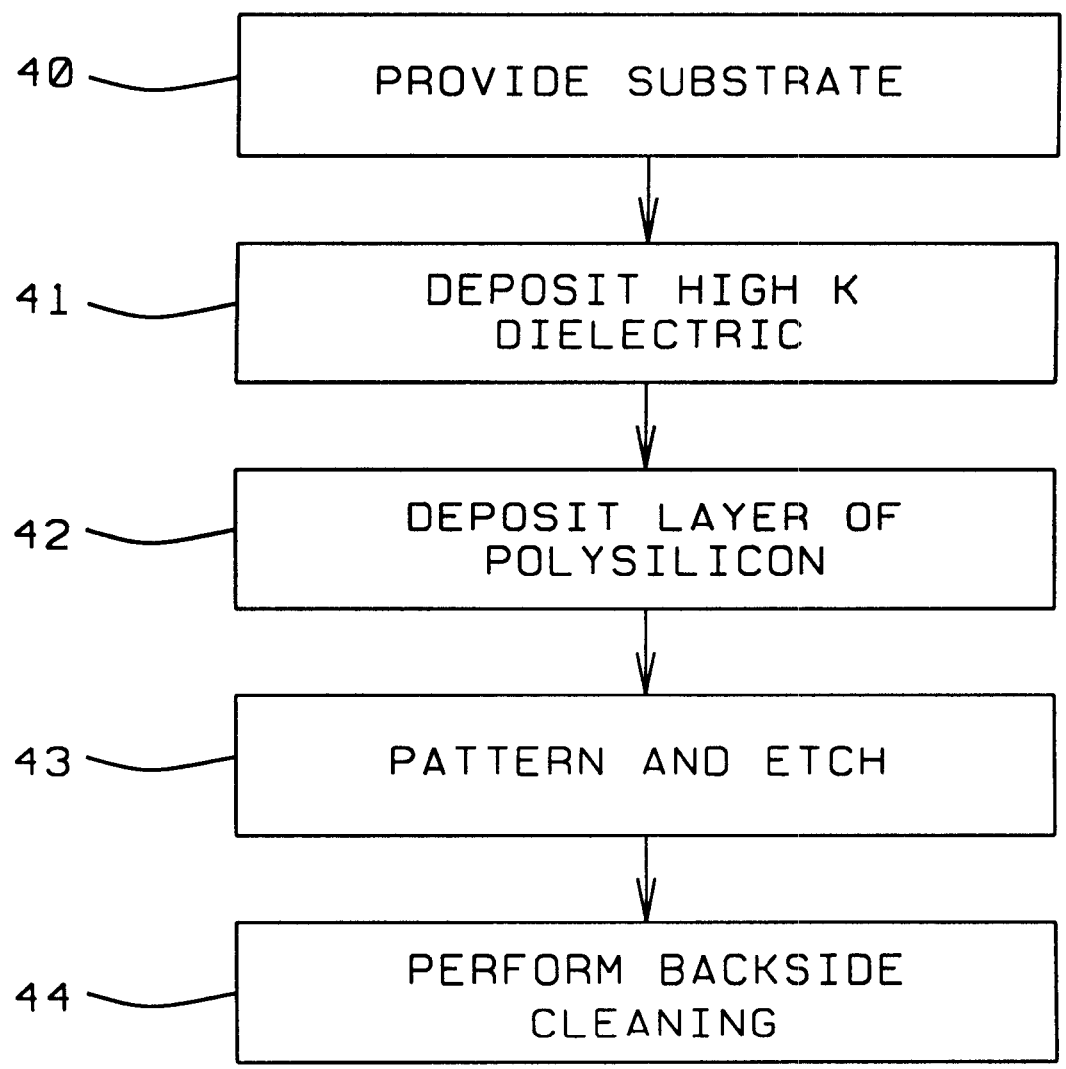
FIG. 4 shows a flow diagram of the third embodiment of the invention.

Referring now specifically to FIG. 4, there is shown a flow diagram of the third embodiment of the invention. The processing steps that are provided under the third embodiment of the invention are as follows:

FIG. 4, step 40, providing a semiconductor substrate

FIG. 4, step 41, depositing a layer of high-k dielectric constant material over the front surface of the substrate FIG. 3, step 42, in-situ depositing a layer of polysilicon over the surface of the layer of high-k dielectric constant material FIG. 3, step 43, patterning and etching the layer of deposited polysilicon and the layer of high-k dielectric constant material, creating a layer of gate dielectric comprising a high-k dielectric constant material over which a patterned layer of polysilicon remains in place forming a layer of a polysilicon gate electrode, FIG. 4, step 44, performing a backside cleaning of the wafer, using mixture solutions that are best suited for removal of contaminants of high-k dielectric constant material and polysilicon for this backside cleaning.

In the art of creating semiconductor devices, dry or wet etching techniques may be employed. Wet etch techniques involves contact with acid solutions at elevated temperatures, using buffered HF. For instance for wet etching may be used solutions of phosphoric acid, nitric acid, acetic acid at temperatures from about 30 degrees C. to about 50 degrees C.

Specifically, the preferred layers of gate dielectric are to comprise a layer of material having a high dielectric constant. As examples of dielectric materials with high dielectric constant can be cited SiN (7.4) and $Al_2O_3$ (8.5). Other materials that meet requirements of high dielectric constant are titanium oxide ($TiO_2$), zirconium oxide ($ZrO_2$), tantalum oxide ($Ta_2O_5$), barium titanium oxide ($BaTiO_3$) and strontium titanium oxide ($SrTiO_3$) This preferred layer of gate dielectric is preferably deposited to a thickness between about 15 and 200 Angstrom and more preferably to a thickness of about 50 Angstrom, using methods of ALCVD and MOCVD procedures at a pressure between about 200 mTorr and 800 mTorr, at a temperature between about 300 and 500 degrees C., followed by annealing at a temperature between about 700 and 900 degrees C.

The layer of material that is deposited over the surface of the layer of high-k dielectric material preferably comprises polysilicon—germanium or doped polysilicon or undoped polysilicon. This layer is deposited using LPCVD procedures, at a temperature between about 500 and 700 degrees C., to a thickness between about 500 to 5000 Angstrom. A layer of doped polysilicon be in-situ doped with an impurity implant of phosphorous (n-type impurity) or boron (p-type impurity).

Specifically, a layer of doped polysilicon can be doped as follows:

for NMOS: N+doped using As or P as a dopant with a dopant dose of between about $1 \times 10^{14}$ and $1 \times 10^{16}$ atoms/$cm^2$ for PMOS: P+doped using $BF_2$ or B as a dopant with a dopant dose of between about $1 \times 10^{14}$ and $1 \times 10^{16}$ atoms/$cm^2$.

A layer of cap-polysilicon preferably comprises undoped polysilicon, deposited using LPCVD procedures, at a temperature between about 600 and 800 degrees C., to a thickness between about 500 to 5000 Angstrom.

The preferred processing conditions for the backside cleaning of the substrate using HF are the application of a wet dip or HF pure vapor are preferred, time for the wet dip is about 30 seconds, the HF vapor uses pure HF with a ratio of $H_2O$: HF=2:1 applied for a time between about 1 and 2 seconds. The indicated HF concentration is cited at this time merely as an example, different HF concentrations can be selected as best suited for a particular application.

Typical processing conditions for the deposition of a layer of polysilicon layer use LPCVD procedures, at a temperature between about 600 and 800 degrees C. The thickness of the layer of polysilicon is application dependent but can for instance, for gate electrode applications, be between about 500 to 5000 Angstrom. Polysilicon, after deposition, can be in-situ doped with an n-type impurity such as phosphorous or arsenic or with an p-type impurity such as indium or boron to a concentration between about 1E20 to 1E21 atoms/$cm^2$. As another example of the creation of a layer of polysilicon can be cited depositing a layer of polysilicon using LPCVD processing to a preferred thickness at a temperature between about 550 and 750 degrees C. An ion implant procedure, using for instance $PH_3$ at an energy between about 20 and 80 KeV and a dose between about 5E14 and 5E15 atoms/cm is used to dope the poly layer. An in-situ doped layer of polysilicon can also be used for this deposition.

For the removal of polysilicon can be applied a mixture of with $SF_6$, $SiO_2$ and $Si_3N_4$. As an alternative, an anisotropic RIE can be applied using $Cl_2$ or $SF_6$ as an etchant. The preferred method of the invention however is to perform backside cleaning using solutions of different concentrations that are best suited for the removal of high-k dielectric and/or polysilicon from a semiconductor surface.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a gate electrode comprising a high-k dielectric material as a gate dielectric, comprising the steps of:

providing a substrate, said substrate having a first surface and a second surface, said second surface being a surface of said substrate over which active semiconductor devices are created;

depositing a layer of high-k dielectric over the second surface of said substrate;

performing a first cleaning of said first surface of said substrate, said first cleaning using a first cleaning mixture;

depositing a layer of polysilicon over the surface of said layer of high-k dielectric material; and patterning and etching said layer of polysilicon and said layer of high-k dielectric, forming patterned layers of high-k dielectric and polysilicon as part of creating a gate electrode.

2. The method of claim 1, with an additional step of performing a second cleaning of said first surface of said substrate, said performing a second cleaning using a second cleaning mixture, said additional step being performed after said step of patterning and etching said layer of dielectric and said layer of high-k dielectric.

3. The method of claim 1, said first cleaning mixture comprising a solution of HF, said first cleaning mixture being selected as having a high etch rate of a high-k dielectric material.

4. The method of claim 2, said second cleaning mixture comprising a solution of HF, said first cleaning mixture being selected as having a high etch rate of a high-k dielectric material and polysilicon.

5. The method of claim 1, said layer of polysilicon being a layer of doped or undoped polysilicon.

6. The method of claim 1, said performing a first cleaning of said first surface of said substrate comprising a wet etch process.

7. The method of claim 1, said performing a second cleaning of said first surface of said substrate comprising a wet etch process.

8. A method for creating a gate electrode comprising a high-k dielectric material as a gate dielectric, comprising the steps of:

providing a substrate, said substrate having a first surface and a second surface, said second surface being a surface of said substrate over which active semiconductor devices are created;

depositing a layer of high-k dielectric over the second surface of said substrate;

depositing a layer of polysilicon over the surface of said layer of high-k dielectric material;

performing a first cleaning of said first surface of said substrate, said first cleaning using a first cleaning mixture;

patterning and etching said layer of polysilicon and said layer of high-k dielectric, forming patterned layers of high-k dielectric and polysilicon as part of creating a gate electrode; and performing a second cleaning of said first surface of said substrate, said second cleaning using a second cleaning mixture.

9. The method of claim 8, said first cleaning mixture comprising a solution of etching agents, said first cleaning mixture being selected as having a high etch rate of a high-k dielectric material and polysilicon.

10. The method of claim 8, said second cleaning mixture comprising a solution of etching agents, said first cleaning mixture being selected as having a high etch rate of a high-k dielectric material and polysilicon.

11. The method of claim 8, said layer of polysilicon being a layer of doped or undoped polysilicon.

12. The method of claim 8, said performing a first cleaning of said first surface of said substrate comprising a wet etch process.

13. The method of claim 8, said performing a second cleaning of said first surface of said substrate comprising a wet etch process.

14. A method for creating a gate electrode comprising a high-k dielectric material as a gate dielectric, comprising the steps of:

providing a substrate, said substrate having a first surface and a second surface, said second surface being a surface of said substrate over which active semiconductor devices are created;

depositing a layer of high-k dielectric over the second surface of said substrate;

depositing a layer of polysilicon over the surface of said layer of high-k dielectric material;

patterning and etching said layer of polysilicon and said layer of high-k dielectric, forming patterned layers of high-k dielectric and polysilicon as part of creating a gate electrode; and performing a first cleaning of said first surface of said substrate, said first cleaning using a first cleaning mixture.

15. The method of claim 14, with an additional step of performing a second cleaning of said first surface of said substrate, said performing a second cleaning using a second cleaning mixture, said additional step being performed after said step of performing a first cleaning of said first surface of said substrate.

16. The method of claim 14, said first cleaning mixture comprising a solution of etching agents, said first cleaning mixture being selected as having a high etch rate of a high-k dielectric material and polysilicon.

17. The method of claim 15, said second cleaning mixture comprising a solution of etching agents, said second cleaning mixture being selected as having a high etch rate of a high-k dielectric material and polysilicon.

18. The method of claim 14, said layer of polysilicon being a layer of doped or undoped polysilicon.

19. The method of claim 14, said performing a first cleaning of said first surface of said substrate comprising a wet etch process.

20. The method of claim 15, said performing a second cleaning of said first surface of said substrate comprising a wet etch process.

* * * * *